United States Patent [19]
Moore

[11] Patent Number: 5,604,927
[45] Date of Patent: Feb. 18, 1997

[54] RECEIVER HAVING AN ADJUSTABLE BANDWIDTH FILTER

[75] Inventor: Paul A. Moore, Seaford, England

[73] Assignee: U.S. Philips Corporation, New York, N.Y.

[21] Appl. No.: 362,621

[22] Filed: Dec. 22, 1994

[30] Foreign Application Priority Data

Dec. 24, 1993 [GB] United Kingdom .................. 9326464

[51] Int. Cl.$^6$ ............................ H04B 1/16; H04B 15/00
[52] U.S. Cl. ...................... 455/266; 455/307; 455/200.1; 455/340; 327/558
[58] Field of Search ................................ 455/266, 306, 455/307, 311, 313, 317, 320, 340, 200.1; 333/174; 327/103, 551, 553, 554, 558

[56] References Cited

U.S. PATENT DOCUMENTS 4,850,038 7/1989 Shibata et al. ........................ 455/311
4,905,306 2/1990 Anderson ............................... 455/340
5,404,589 4/1995 Bijker ..................................... 455/266

FOREIGN PATENT DOCUMENTS 2-50624 2/1990 Japan .

Primary Examiner—Chi H. Pham
Attorney, Agent, or Firm—Bernard Franzblau

[57] ABSTRACT

A radio receiver has a frequency down conversion stage including a first passive filter tuned to a lower frequency. An amplifier functioning as a voltage-to-current converter includes a resistor (60) which can be shunted by a second passive filter in response to actuation of symmetrically arranged switching devices. When the second passive filter shunts the resistor, the overall pass band is raised to a higher frequency. Additionally, the amplifier has a lower noise figure when the second passive filter shunts the transconductor.

15 Claims, 3 Drawing Sheets

RECEIVER HAVING AN ADJUSTABLE BANDWIDTH FILTER

BACKGROUND OF THE INVENTION

1. Field of the Invention

The present invention relates to a radio frequency receiver and particularly, but not exclusively, to an adjustable bandwidth filter for use in a radio frequency receiver for receiving particularly, but not exclusively, digital signals.

2. Description of the Related Art

Communication receivers for receiving digital signals, for example, digitized speech, are well known and frequently have an architecture in which a received signal is applied to an adjustable gain r.f. amplifier prior to a first frequency down conversion stage which produces an i.f. frequency. The i.f. frequency is filtered in, for example, a SAW filter and the filtered signal is applied to another frequency down conversion stage in which the i.f. signal is applied to nominally quadrature related mixers, the outputs of which are low-pass filtered and then applied to a digital signal processor (DSP). FIG. 1 illustrates a typical low-pass filter input-output characteristic in which the ordinate is amplitude in db and the abscissa is frequency f. The wanted signal band is indicated as $f_w$ and the unwanted higher band of frequencies is indicated as $f_{uw}$. The receiver noise level is indicated by a horizontal broken line RNL. As is known in the art, in order to be able to determine the correct value of a digital signal, the amplitude of the input signal need only be several dbs above a level termed the Minimum Distinguishable Signal MDS. Accordingly, there is little point in designing filters to handle much bigger signals if the result is the consumption of a lot more current.

If the input signal applied to the low-pass filter should significantly exceed this MDS level, the filter will then be overdriven. Eliminating this problem could lead to an unwanted increase in current consumption due to the filter having to be designed to cope with a dynamic range of input signals which is much larger than is strictly necessary. Generally, this problem is countered by the DSP applying automatic gain control signals to the adjustable gain r.f. amplifier.

In the interests of current saving, the low-pass filters are thus generally designed to handle a limited dynamic range of wanted signals and to consume a low power. However, a problem arises when strong unwanted signals need to be blocked by the filters as there is no AGC applied by the DSP. The filters must be able to cope with such unwanted signals in a linear way. If the filters are designed to be capable of handling large unwanted signals, this could lead to a significant increase in power consumption, for example, 141 times more power would be required for handling an unwanted signal which is greater than the MDS level by 23 db, than for a signal just above that level.

Such low-pass filters are not infrequently voltage driven transconductor filters. However, if such filters comprise current driven transconductor filters then a much larger signal, for example, 14.5 db larger in the case of a Gaussian to 6 db filter, can occur in the stop-band than in the wanted band without the filter going non-linear. Even with this improvement, there is still a desire to cope with an even larger signal, for example, up to 23 db larger, in the stop-band, without the filter going non-linear and also to make the filter have an adjustable bandwidth to be able to selectively pass a narrow band signal which, for example, occurs in the Pan-European or GSM cellular telephone system, and a wider band signal which, for example, occurs in the Digital European Cordless Telephone (DECT) system.

SUMMARY OF THE INVENTION

According to the present invention, there is provided a radio frequency receiver comprising a frequency down conversion stage which includes first passive filtering means having a first cut-off frequency, first and second outputs from the frequency down conversion stage, an amplifier having first and second active devices coupled, respectively, to the first and second outputs and having respective current outputs, first resistive means interconnecting corresponding electrodes of the first and second active devices, filtering means having inputs for receiving current outputs from said first and second active devices, said filtering means including transconducting means connected to said inputs, and second passive filtering means which are connectable in parallel with said first resistive means, whereby when said second passive filtering means is not connected in parallel with the first resistive means, a narrow band signal is applied to the filtering means and when said second passive filtering means is connected in parallel with the first resistive means, a wideband signal is applied to the filtering means.

By providing the first passive filtering means in the frequency down conversion stage and a current driven transconductor filtering means, the level of signal in the stop band which can be handled without the filter going non-linear is increased from 14.5 db to 23 db without increasing the current consumption. The provision of the second passive filtering means enables the filter bandwidth to be selectively adjustable.

The second passive filtering means may comprise second and third resistance means of substantially equal resistance value, each second and third resistive means having first and second ends, the first ends being coupled to respective ends of the first resistive means, capacitive means, and first and second switching means being coupled, respectively, between the second ends of the second and third resistive means and the capacitance means, whereby when said first and second switching means are conductive, the second passive filtering means shunts the first resistive means, and when said first and second switching means are non-conductive, the second passive filtering means is disconnected electrically from the first resistive means. The first and second switching means may comprise field-effect transistors, and by locating them between the second and third resistive means and the capacitive means, it is possible to operate the switching means using relatively small d.c. voltages and minimize non-linearities due to differences in potential between the first switching means and the substrate and the second switching means and the substrate. Also, using two switching means rather than one maintains the symmetry of the circuit and in so doing avoids the risk of introducing other non-linearities. An advantage of arranging the second passive filtering means to be connected in parallel with the first resistive means when selecting the wider band signals is that the narrow band signal is not compromised because the second and third switching means are then open (non-conductive) and the non-linearities are not present.

BRIEF DESCRIPTION OF THE DRAWINGS

The present invention will now be described, by way of example, with reference to the accompanying drawings, wherein.

In the drawings the same reference numerals have been used to indicate corresponding features.

DESCRIPTION OF THE PREFERRED EMBODIMENT

Figure 1:
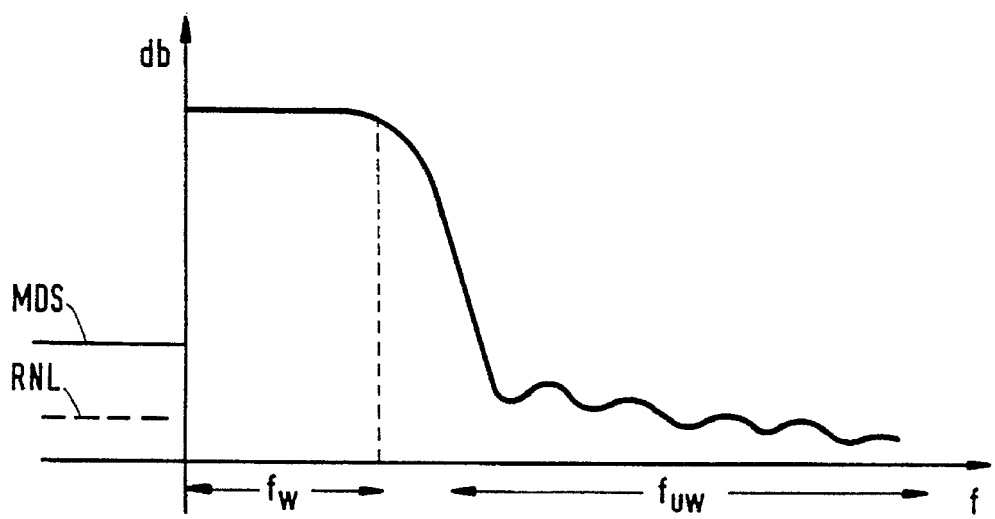
FIG. 1 is a graph of a low-pass filter characteristic.
Figure 2:
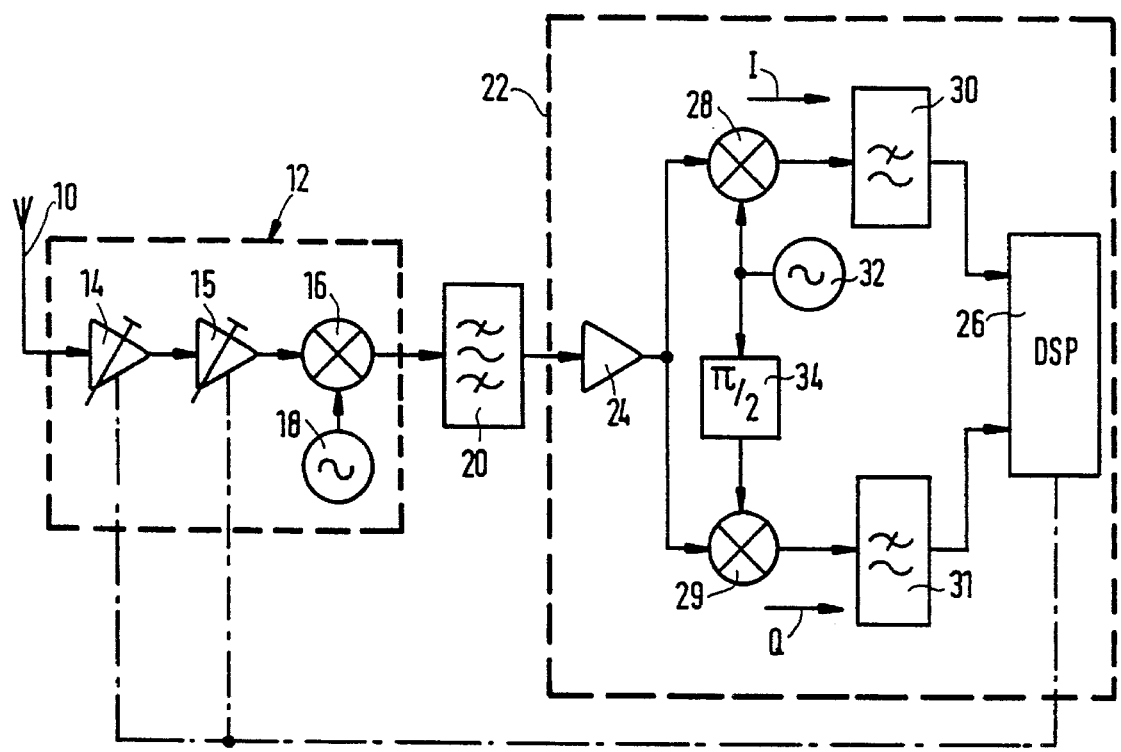
FIG. 2 is a block schematic diagram of a radio frequency receiver.

Referring to FIG. 2, the receiver comprises an antenna 10 which is connected to an r.f. input stage 12 comprising adjustable gain r.f. amplifiers 14,15 and a mixer 16 connected in cascade and a first local oscillator 18 connected to the mixer 16. The products of mixing are supplied to a band-pass filter 20 which selects the desired band of intermediate frequencies (i.f.). A second frequency down conversion stage 22 is coupled to an output of the filter 20. The stage 22 comprises an i.f. amplifier 24 and two nominally quadrature related signal paths I and Q which are connected to inputs of a DSP 26. Each of the I and Q signal paths comprises a mixer 28,29 having an input coupled to an output of the amplifier 24 and an adjustable bandwidth low-pass filter 30,31 coupled between its mixer 28,29, respectively, and the DSP 26. The nominally quadrature related signal paths I and Q are obtained in the illustrated receiver by supplying a local oscillator signal nominally in quadrature to the mixers 28,29. This is done by connecting an output of a local oscillator 32 directly to the mixer 28 and to a nominally π/2 phase shifter 34 having an output connected to the mixer 29. The DSP 26 not only is used to recover the signal but also is used to control the gain of one or both r.f. amplifiers 14,15 so that the amplitude of the wanted signal $f_w$ (FIG. 1) is only slightly greater than the MDS level. The operation of this type of receiver is generally well known and has been summarized in the preamble of this specification.

Figure 3:
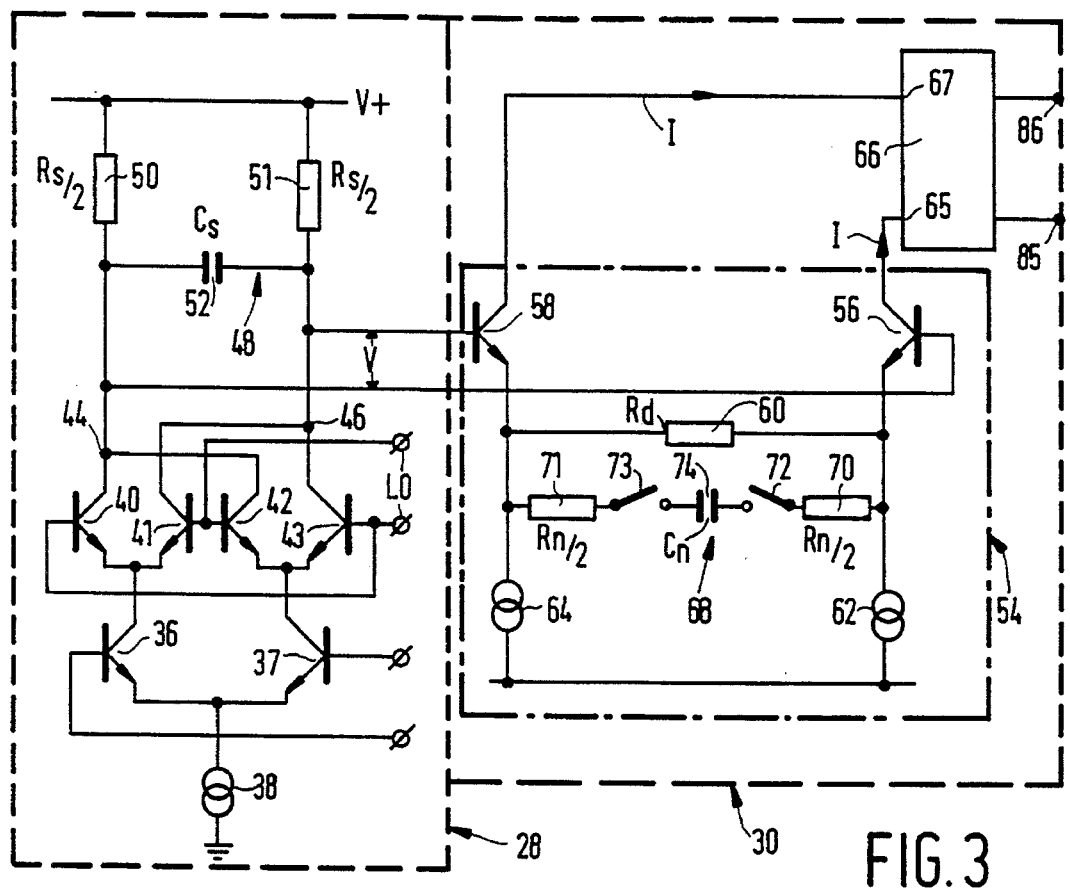
FIG. 3 is a schematic diagram of a mixer and low-pass filter arrangement.

FIG. 3 illustrates an embodiment of a mixer 28 and a low-pass filter 30 having a switchable bandwidth. The mixer 28 comprises a first long-tail pair circuit formed by NPN transistors 36,37 whose base electrodes receive an input signal from the amplifier 24 (FIG. 2) and whose emitter electrodes are jointly connected to a current source 38. The collector electrodes of the transistors 36,37 are respectively connected to second and third long-tail pair circuits formed by pairs of NPN transistors 40,41 and 42,43. The emitter electrodes of the pairs of transistors 40,41 and 42,43 are respectively connected to the collector electrodes of the transistors 36,37. The base electrodes of the transistors 40,43 are interconnected as are the base electrodes of the transistors 41,42. A local oscillator (LO) source is connected to the respective interconnections. The collector electrodes of the transistors 40,42 and of the transistors 41,43 are interconnected at junctions 44,46, respectively. The junctions 44,46 are coupled to a supply rail V+ by way of a first passive filtering means 48 formed by resistive devices 50,51 of substantially equal value connected respectively, between the junctions 44,46 and the supply line V+ and by a shunt capacitor 52.

Figure 6:
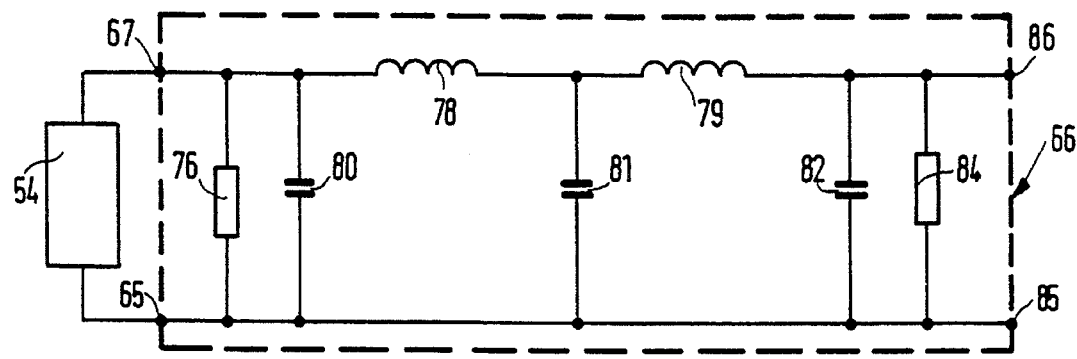
FIG. 6 is an equivalent circuit of a 5th order current driven transconductance filter.

The partially filtered output voltages appearing at the junctions 44,46 are supplied to a post mixer amplifier consisting of a voltage-to-current converter 54 comprising NPN transistors 56,58 whose base electrodes are connected respectively, to the junctions 44,46, whose emitter electrodes are interconnected by an emitter degeneration resistive device 60 and are connected to respective current sources 62,64, and whose collector electrodes are connected to respective inputs 65,67 of a current driven transconductor filter 66 to be described with reference to FIG. 6.

A second, switchable passive filtering means 68 is connectable in parallel with the resistive device 60. The filtering means comprises two substantially equal value resistive devices 70,71 having one end connected, respectively, to the emitter electrodes of the transistors 56,58, a capacitive element 74 and switch devices 72,73 connected between the second ends of the resistive devices 70,71, respectively, and respective plates of the capacitive element 74.

Figure 4:
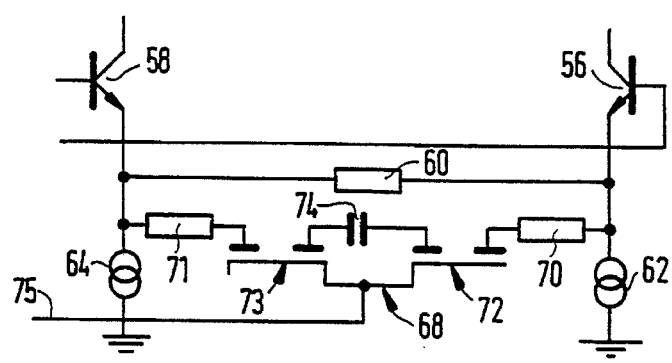
FIG. 4 is a schematic circuit diagram of the voltage to current converter 54 shown in FIG. 3 in which the switch devices 72,73 comprise field-effect transistors.

FIG. 4 illustrates an embodiment in which the switch devices 72,73 comprise field-effect transistors, the gate electrodes of which are connected to a bandwidth control input 75. The switch devices 72,73 are non-conductive when the second passive filtering means 68 is non-operative and the overall circuit is behaving as a narrow band filter, and are conductive, in response to a signal on the input 75, when the second passive filtering means 68 is shunting the resistive device 60 to provide a broader bandwidth filter. An advantage of such an arrangement is that narrow band systems tend to have relatively stringent linearity requirements and by the field-effect transistors being non-conductive for narrow band operation, the risk of the on-resistance of these transistors degrading the performance of the first passive filtering means is avoided.

Figure 5:
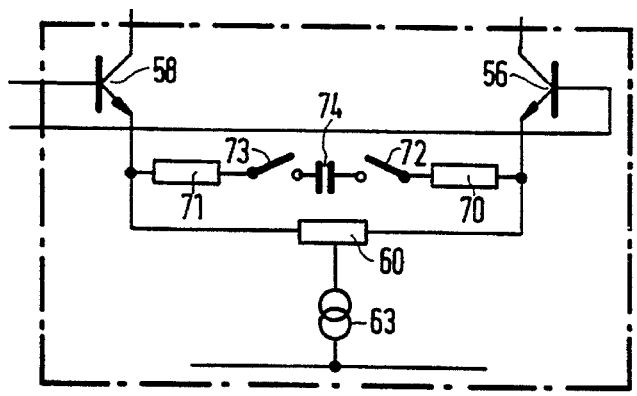
FIG. 5 is a schematic diagram of a variant of the voltage to current converter 54 shown in FIG. 3.

FIG. 5 is a variant of the voltage-to-current converter 54 in which the current sources 62,64 are combined into one current source 63 which is connected to a center tap of the resistor 60. An advantage of using a single current source is that any noise which is generated is rejected due to it being a common mode signal. However, such an arrangement is not suited to low voltage circuits because of the dc drops across the respective parts of the resistor 60.

The current driven transconductor low-pass filter 66 (FIG. 6) comprises a transconductor 76 configured as a resistor connected between the inputs 65,67, a simulation of an LC filter comprising two series connected inductances 78,79 and three shunt capacitive elements 80,81,82 and a transconductor 84 configured as a resistor connected to outputs 85,86.

Figure 7:
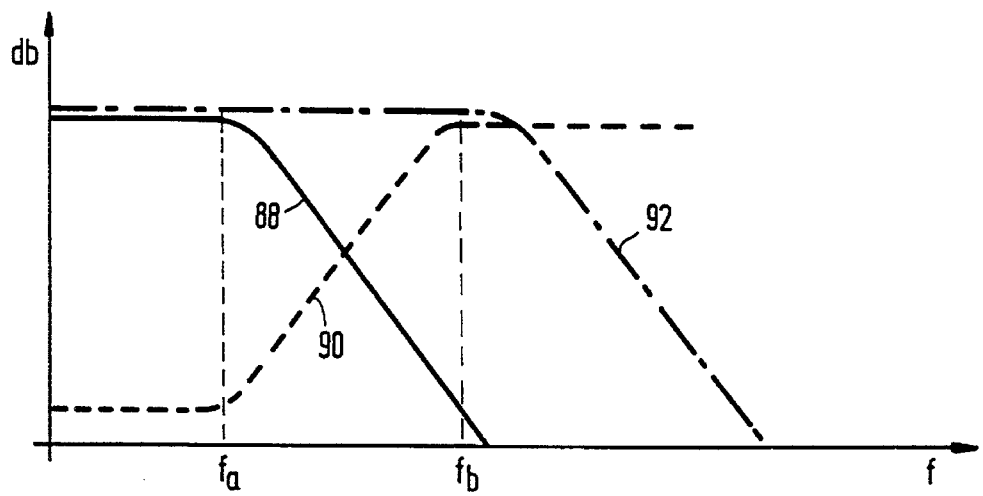
FIG. 7 is a graph of the various individual and composite filter characteristics.

FIG. 7 illustrates how the second, switchable passive filtering means can be used to widen the filter response. With the switches 72,73 open, the filter response 88 is that shown by the continuous line and is produced by the first passive filtering means. The response is a narrow band response having a cut-off above a wanted frequency $f_a$ but below the frequency $f_b$ of the alternative wanted broadband signal. The second, switchable passive filtering means modifies the normally frequency independent response of the voltage to current converter 54 so that it has the response 90 shown in broken lines. By closing the switch devices 72,73, an overall broadband filter response 92 shown in chain-dot lines is thus obtained. By making the resistive and capacitive elements 70,71,74 of the same materials as those used for making the components of the first passive filter, the two filter responses track each other. This can be illustrated mathematically by giving the following components the value indicated:

Resistors $50,51=R_s/2$
Capacitor $52=C_s$
Resistor $60=R_d$
Resistors $70,71=R_n/2$
Capacitor $74=C_n$
Frequency $f_a$ is defined by the product $C_s \times 2(R_s/2)=C_s R_s$ $$R_n = 2 \times (R_n/2) = \frac{R_d}{\left(\frac{f_b}{f_a} - 1\right)} \quad (1)$$

$$C_n = \left(1 - \frac{f_a}{f_b}\right) \frac{R_s}{R_d} \cdot C_s \quad (2)$$

The presence of the resistor, capacitor and frequency ratios confirms that tracking will occur.

As mentioned, two switch devices 72,73 are provided in order to maintain symmetry and thereby avoid introducing non-linearities. By arranging these devices 72,73 to be on either side of the capacitive element 74 then the effect of voltage variations with respect to the substrate are very small or substantially zero. However, if the switch devices 72,73 were located on the other sides of the resistive elements 70,71, then the effect of voltage variations with respect to the substrate will be much larger, which is undesirable. As the frequency increases, the voltage across the capacitive element 74 goes down thereby causing the switch devices 72,73 to get closer together, differences in the influence of the substrate on the on-resistance diminishing.

Figure 8:
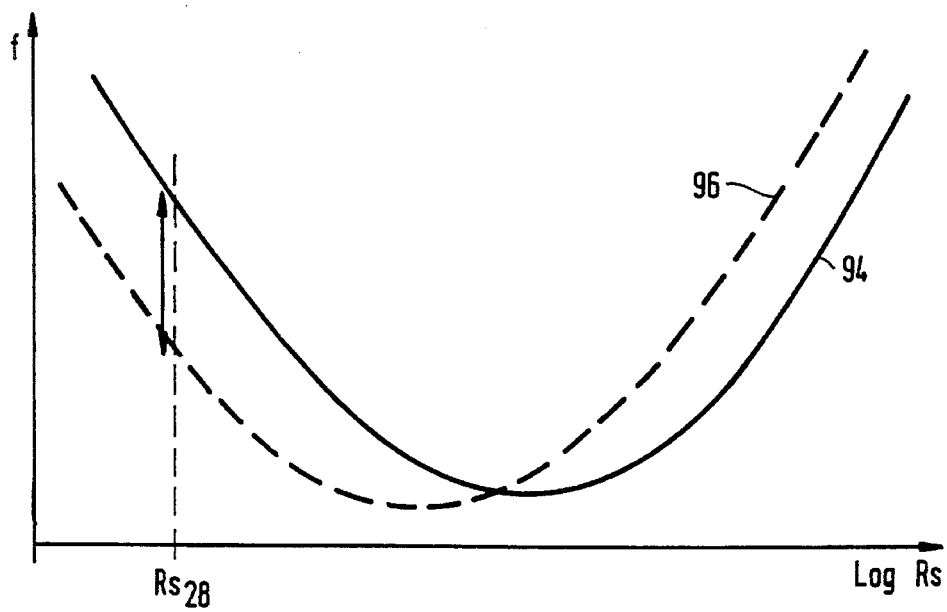
FIG. 8 is a graph of the noise figure of the voltage to current converter as a function of the logarithm of the source resistance (Log $R_s$) versus frequency (f).

Referring now to FIG. 8, the curve 94 shown by a full line is the typical noise characteristic of an amplifier. This characteristic has a minima which indicates the value of the source resistance Rs which gives the best noise figure. In the circuit shown in FIG. 3, the voltage-to-current converter 54 sees the output resistance ($Rs_{28}$) of the mixer 28 which is less than the optimum value. This is normally the case and is a consequence of the resistive device 60 being relatively large so that the linearity of the voltage-to-current converter 54 is adequate. The optimum value of Rs would typically be hundreds of kilo-ohms. Working at one end of the characteristic has the benefit that when the second passive filtering means 68 is switched into the circuit and at frequencies greater than $f_a$, the noise characteristic is shifted towards the ordinate and becomes the curve 96 shown in broken lines and for a source resistance $Rs_{28}$, the noise figure has been reduced. The noise performance of the voltage-to-current converter is dependent on the net effective resistance of the totality of the network comprising the resistive devices 60,70,71 and the capacitance 74. By closing the switch devices 72,73, the effective on-resistance of the switch devices 72,73 is made negligible to the totality of resistive devices 60,70,71 and the capacitance 74. The shift in the characteristic is explained by the fact that at a frequency $f_b$, say 576 kHz, which is greater than the frequency $f_a$, say 80 kHz, the value of $R_n$ (resistive devices 70,71) is less than the value $R_d$ (resistive device 60), see equation (1) above for a ratio of $$\left(\frac{f_b}{f_a}\right) = \frac{576}{80} = 7.2$$

Thus the curve is moved in a direction of reducing the source resistance and, as a consequence, for the same value of $Rs_{28}$, the noise figure is lower. Additionally, as the amplitude of the signal at the mixer output decreases at higher frequencies and the noise figure is improving, then the signal-to-noise ratio at the input to the voltage-to-current converter 54 remains substantially unchanged, in other words, the amplitude of the mixer output and the noise figure effectively track each other. In a specific example of the second passive filter for $f_a$=80 kHz and $f_b$=576 kHz, $R_d$=20 k$\Omega$, $R_n$=3.23 k$\Omega$, $R_s$=6.6 k$\Omega$, $C_s$=217 pF and $C_n$ =61.7 pF. The cut-off frequency of the current driven transconductor filter 66 can also be tuned from $f_a$ to $f_b$ in known manner.

From reading the present disclosure, other modifications will be apparent to persons skilled in the art. Such modifications may involve other features which are already known in the design, manufacture and use of radio frequency receivers and filters thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

I claim:

1. A radio frequency receiver comprising: a frequency down conversion stage which includes first passive filtering means having a first cut-off frequency, first and second outputs from the frequency down conversion stage, an amplifier having first and second active devices coupled respectively to the first and second outputs and having respective current outputs, first resistive means interconnecting corresponding electrodes of the first and second active devices, filtering means having inputs for receiving current outputs from said first and second active devices, said filtering means including transconducting means connected to said inputs, and second passive filtering means which is selectively connected in parallel with said first resistive means, whereby when said second passive filtering means is not connected in parallel with the first resistive means a narrow band signal is applied to the filtering means and when said second passive filtering means is connected in parallel with the first resistive means a wideband signal is applied to the filtering means.

2. A receiver as claimed in claim 1, wherein the second passive filtering means comprises second and third resistive means of substantially equal resistance value, each of said second and third resistive means having first and second ends, the first ends being coupled to respective ends of the first resistive means, capacitive means, and first and second switching means coupled respectively between the second ends of the second and third resistive means and the capacitance means, whereby when said first and second switching means are conductive the second passive filtering means shunts the first resistive means and when said first and second switching means are non-conductive the second passive filtering means is disconnected electrically from the first resistive means.

3. A receiver as claimed in claim 2, wherein the first and second switching means comprise field effect transistors.

4. A receiver as claimed in claim 2, wherein the total resistance value of the second and third resistive means is less than the resistance value of said first resistive means.

5. A receiver as claimed in claim 1, wherein components of the first and second passive filtering means are fabricated from the same materials.

6. A receiver as claimed in 2, further comprising respective current sources connected to respective junctions formed by the first ends of the second and third resistive means with the respective ends of the first resistive means.

7. A receiver as claimed in claim 1, wherein the first resistive means has a tap and a current source is connected to the tap.

8. The receiver as claimed in claim 1 further comprising:
- an adjustable gain RF amplifier coupled upstream of said frequency down conversion stage, and
- a signal processor coupled down stream of said amplifier and responsive to a signal determined by output signals of the amplifier to control the gain of said RF amplifier so that a signal is produced that is only slightly greater than the MDS level.

9. A combination mixer/adjustable bandwidth filter circuit comprising:
- a mixer stage having transistor means which receive an IF signal and a local oscillator signal, and a first passive filter coupled to said transistor means to produce an output signal having a first cut-off frequency, and
- an adjustable bandwidth filter comprising;
- first and second transistors which receive said output signal and have respective current outputs,
- first resistive means interconnecting corresponding electrodes of the first and second transistors,
- a second passive filter selectively coupled in parallel with said first resistive means so that, when the second passive filter is not coupled in parallel with the first resistive means the combination circuit exhibits a narrow bandwidth with said first cut-off frequency, and when the second passive filter is coupled in parallel with the first resistive means the combination circuit exhibits a wider bandwidth with a higher cut-off frequency, and
- a current driven transconductance filter having input means for receiving current outputs from said first and second transistors.

10. A combination circuit as claimed in claim 9 wherein the second passive filter comprises:
- a second resistive means, a first switching means, capacitive means, a second switching means and a third resistive means connected in series circuit in the order named across the first resistive means, and wherein the resistance of said second resistive means is substantially equal to the resistance of said third resistive means.

11. A combination circuit as claimed in claim 10 wherein the first and second switching means comprise first and second field effect transistors having their gate electrodes connected in common to a bandwidth control input terminal.

12. A combination circuit as claimed in claim 9 further comprising current source means coupled to said corresponding electrodes of the first and second transistors.

13. A combination circuit as claimed in claim 9 wherein the second passive filter comprises:
- a second resistive means, a first switching means, capacitive means, a second switching means and a third resistive means connected in series circuit across the first resistive means, wherein the resistance of said second resistive means is substantially equal to the resistance of said third resistive means and the total resistance of the second and third resistive means is less than the resistance of said first resistive means.

14. A combination circuit as claimed in claim 12 wherein said current source means comprise first and second current sources connected in series with said first and second transistors, respectively.

15. A receiver as claimed in claim 1 wherein the second passive filtering means comprises second and third resistive means of substantially equal resistance value, capacitive means and switching means connected in series circuit across the first resistive means, and
- the total resistance value of the second and third resistive means is less than the resistance value of said first resistive means.

\* \* \* \* \*